United States Patent [19]

Bagley et al.

[11] Patent Number: 4,929,598

[45] Date of Patent: May 29, 1990

[54] OXYGEN PLASMA TREATMENT OF YTTRIUM BARIUM COPPER OXIDE

[75] Inventors: Brian G. Bagley, Watchung Boro; Jean-Marie Tarascon, Millington, both of N.J.

[73] Assignee: Bell Communications Research, Inc., Livingston, N.J.

[21] Appl. No.: 292,020

[22] Filed: Dec. 30, 1988

Related U.S. Application Data

[62] Division of Ser. No. 64,803, Jun. 19, 1987, abandoned.

[51] Int. Cl.$^5$ .......................... B05D 5/12; B05D 3/06
[52] U.S. Cl. .......................................... 505/1; 427/39; 427/62
[58] Field of Search .................. 505/1; 427/38, 39, 62, 427/63; 29/599

[56] References Cited

U.S. PATENT DOCUMENTS 4,362,765  12/1982  Abe et al. .............................. 427/38

FOREIGN PATENT DOCUMENTS 61-168530  7/1986  Japan .

Primary Examiner—Norman Morgenstern
Assistant Examiner—Margaret Bueker
Attorney, Agent, or Firm—James W. Falk; Edward M. Fink

[57] ABSTRACT

A method is described for the preparation of superconducting compositions in the yttrium-barium-copper oxide system. The oxygen stoichiometry required to assure the superconducting state is attained by a either a thermal annealing process or by means of plasma oxidation.

3 Claims, 1 Drawing Sheet

OXYGEN PLASMA TREATMENT OF YTTRIUM BARIUM COPPER OXIDE

This is a division of application Ser. No. 064,803 filed June 19, 1987 now abandoned. This invention relates to a method for the preparation of superconducting compositions of the yttrium-barium-copper-oxygen system.

Although the phenomenon of superconductivity was discovered some 75 years ago, and although it was immediately apparent that the property was important in, for example, the development of loss free conductive systems and non-dissipating magnetic configurations, the intervening years have seen little in the way of a practical realization. Although this was initially due, at least in part, to the difficulty and expense involved in maintaining superconducting materials at temperatures below their transition temperature (not generally exceeding of the order of 10 or 11 degrees Kelvin), this difficulty was largely removed by developments in low temperature apparatus. Nonetheless, the only practical method to attain temperatures at that level has been by the use of liquid helium, an element which is rare and costly to liquefy. Consequently, it has only been in rare instances when the benefits of superconductivity have overshadowed the high cost of liquid helium Thus, workers in the art have long sought superconducting systems which evidence the unique characteristic of superconductivity at less extreme temperatures, for example, at temperatures greater than 77° K., the temperature at which nitrogen is liquefied. Quite obviously, the discovery of such systems would revolutionize the field, particularly in light of the fact that nitrogen is readily available and at only a fraction of the cost of helium.

Early in 1985, researchers discovered superconductivity at 30° K. in an oxide containing lanthanum, barium and copper. However, the superconducting transition, that is, the temperature at which the resistance of the material suddenly drops to zero ($T_c$) was considered still too low, too broad and not abrupt. Spurred by this activity, different groups of researchers focused upon other rare earth oxide systems and succeeded in attaining higher and sharper superconducting transitions. With the passage of time, the scientific community reported attaining transition temperatures of the order of 90° K. in an oxide system comprising yttrium, barium and copper. These oxides which evidenced a superconducting critical temperature, $T_c$, of approximately 95° K. were found to be superconducting when immersed in liquid nitrogen.

Unfortunately, the yttrium barium copper oxides reported heretofore have not been found to be superconducting in every case, such being attributed to the inability to meet the oxygen stoichiometry requirements for superconductivity. While these materials should be of interest for magnetic field applications, thus far, studies have revealed that the critical currents of these oxides are too low for high magnetic field applications, as for example in solenoids, so raising the question as to the likelihood of their maintaining the superconducting state at high current densities. Nevertheless, the current densities presently exhibited by these materials are adequate for zero resistant metalization interconnects for integrated circuits operating at liquid nitrogen temperatures (79° K.).

In accordance with the present invention, a technique is described for optimizing the preparation of the 90–95° K. superconducting compositions in the yttrium-barium-copper oxide system This end is attained by either annealing and cooling the described compositions in accordance with a prescribed schedule which assures the correct oxygen stoichiometry or by a near room temperature plasma oxidation which also provides the required oxygen stoichiometry. This latter process is of particular interest in the preparation of superconducting metal interconnects for integrated circuits operating at liquid nitrogen temperatures wherein the temperatures encountered in thermal processing would inherently degrade the semiconductor and other device components.

These structures are oxygen deficient perovskites in which oxygen atoms that should be connected to intermediate copper atoms are absent.

We have determined that by processing these materials in accordance with this invention, oxygen atoms enter the vacant sites in the perovskite structure, so resulting in continuous copper-oxygen chains or planes. In preparing the $YBa_2Cu_3O_{7-x}$ structures, we have observed that the value of x cannot exceed 0.75, the point at which superconductivity is lost.

The invention will be more fully understood by reference to the accompanying drawing and specification wherein.

Figure 1:
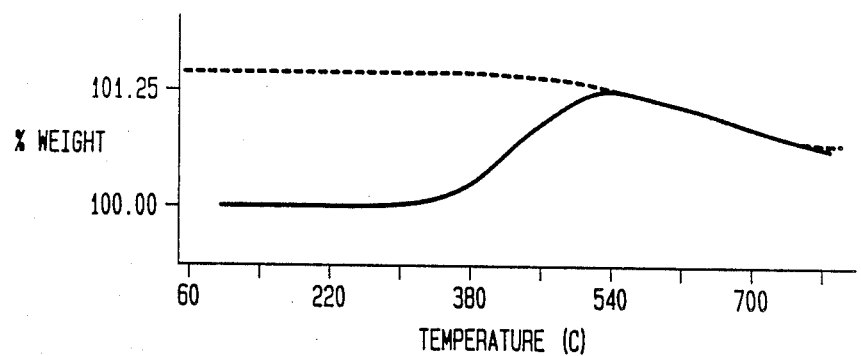
FIG. 1 is a graphical representation on coordinates of temperature in degrees Centigrade against per cent weight of sample based on an arbitrary weight of 100 showing the thermogravimetric analysis for oxygen loss or uptake of $YBa_2Cu_3O_{7-x}$ samples.

The first step in the practice of the present invention involves preparing the rare earth oxide of interest. This end is attained by mixing appropriate quantities of barium carbonate, yttrium oxide and copper oxide powders of 99.999 per cent purity. The mixed powders are placed in a crucible and the crucible inserted in a furnace and heated up to a temperature within the range of to 1000° C. for a time period ranging from 9 to 11 hours, the shorter time periods corresponding with the higher temperatures, the material being held at those temperatures for approximately 72 hours to insure complete reaction. Following, the crucible is cooled to a temperature of the order of 300° C. over a period of 2 hours, and removed from the furnace. The resultant material is then crystallized into a sparkling black powder which is then ground and pressed and subjected to another heating treatment. This treatment consists of regrinding the powder, heating in oxygen between 900° C.–1000° C. for two days and then cooling to room temperature in 2 hours.

Next, the crystalline material is subjected either to thermal annealing in the presence of oxygen or to an oxygen plasma near room temperature. In the thermal process the material is reheated in oxygen at a temperature within the range of 410° –540° C. for a time period of the order of two hours. During this treatment, oxygen atoms diffuse into the material and occupy the vacant sites alluded to hereinabove so that the value of x in the formula $YBa_2Cu_3O_{7-x}$ is less than 0.75. Then, the composition is close to the oxygen stoichiometry of seven oxygen atoms per formula unit and provides superconductivity between 90° and 95° K. This end may also be attained by plasma oxidation in a cylindrical reactor at a power density of less than 0.005 watts/cu³ by RF heating at an oxygen pressure of the order of 0.7 Torr. and a frequency of 13.56 MHz. In this process, the sample being treated is in contact with an unheated silica support which allowed exposure of essentially the entire sample to the plasma. It will be appreciated that the noted exposure parameters reflect the conditions dictated by sample size. Furthermore, it will be recognized that the oxidation kinetics may be enhanced by higher current densities, higher pressures and temperatures, small sample thickness the other reactor geometrics. It will also be understood that the plasma may be used to delineate superconducting metallic interconnections for integrated circuits operating at liquid nitrogen temperatures. Then, the material is cooled in oxygen at a rate of 10° C. per minute until the sample is near room temperature, the oxygen remaining in the composition during this sequence.

An example of the practice of the present invention is set forth below. It will be appreciated by those skilled in the art that this example is solely for purposes of exposition and is not to be construed as limiting.

EXAMPLE

Samples of $YBa_2Cu_3O_{7-x}$ were prepared by thoroughly mixing 99.999 per cent purity $Y_2O_3$, $BaCO_3$ and $CuO$ powders. The mixture so obtained was packed into an alumina crucible and placed in a tubular furnace and heated to a temperature of 960° C. in air for 10 hours. The mixture was maintained at this temperature and then cooled over a time period of 2 hours to 300° C. and removed from the furnace. The resulting material was found to be a crystallized sparkling black powder. A part of the product so obtained was set aside to select single crystals for X-ray studies and the remainder was ground, pressed into a ½ inch diameter pellet and reheated in oxygen at 940° C. for 2 days and then cooled for 2 hours. Finally, the pellets were cut in rectangular bars for resistivity measurements and the remainder ground for powder X-ray diffraction, thermogravimetric analysis and magnetic susceptibility measurements. The crystal structure of the composition prepared revealed the presence of oxygen defects. Annealing of the composition in vacuum and in oxygen at varying temperatures revealed striking characteristics.

With reference now to FIG. 1, there is shown a graphical representation on coordinates of temperature in degrees Centigrade against per cent weight of sample based upon an arbitrary weight of 100 showing the thermogravimetric analysis of the oxygen uptake and loss of $YBa_2Cu_3O_{7-x}$ samples, prepared as described, when heated and cooled in an oxygen ambient. It will be noted that in this annealing/cooling cycle oxygen atoms are gained in the annealing process over a temperature varying from 410–540° C., so occupying vacant sites and providing the proper stoichiometry for superconductivity, that is, the value of x in the generic formula is less than 0.75. At temperatures greater than 540° C. the oxygen atoms begin to diffuse out of the composition thereby causing a degradation in superconductivity. However, cooling in oxygen over the range of 410–540° C. restores the optimum oxygen content for the required level of stoichiometry.

Figure 2:
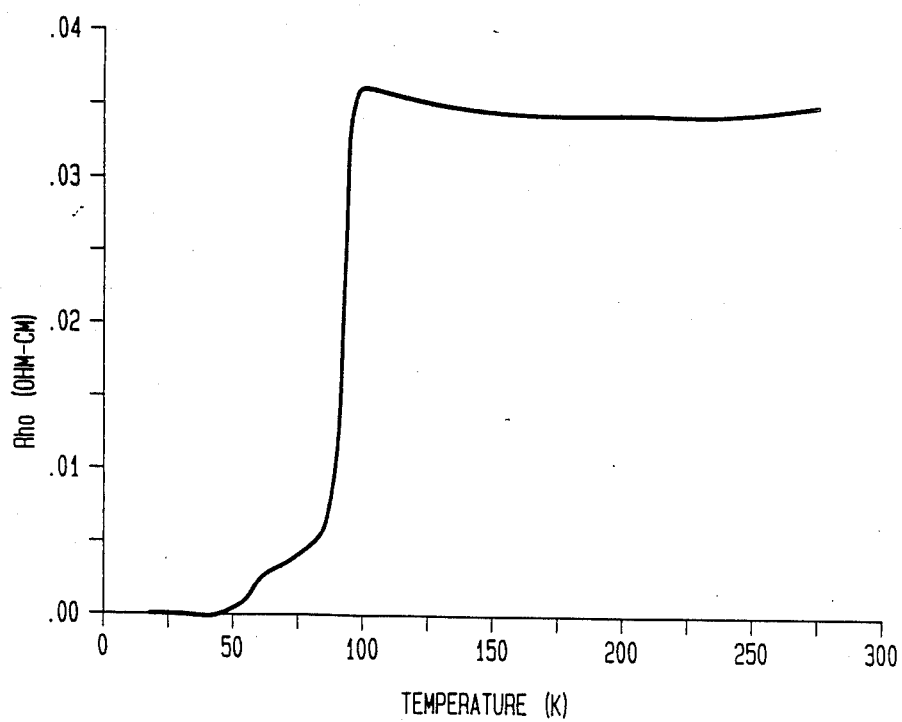
FIG. 2 is a graphical representation on coordinates of temperature in degrees Kelvin against resistivity in ohm-centimeters showing the affect of an oxygen plasma treatment upon a sample of nonsuperconducting $YBa_2Cu_3O_6$.

FIG. 2 is a graphical representation on coordinates of temperature in degrees Kelvin against resistivity in ohm centimeters showing the effect of an oxygen plasma treatment upon a non-superconducting composition of the formula $YBa_2Cu_3O_6$ which was obtained by vacuum annealing $YBa_2Cu_3O_{(7-x)}$ 450° C. for 15 hours at $10^{-3}$ Torr.

The oxygen plasma treatment involved treating the composition in a cylindrical reactor at a power density of 0.005 watts/cu³, a frequency of 13.56 $MH_2$, an oxygen pressure of 0.7 Torr., and a temperature of 70° C. for 124 hours, so resulting in the restoration of superconductivity. It will be noted that at the initiation of treatment (298° K.) there was no superconductivity. However at 95° K. the material begins to lose resistance and at 50° K. its resistance has diminished to 0. Within the range of 90–95° K. essentially all of the resistance has disappeared.

What is claimed is:

1. Method for the preparation of a superconducting thin film composition of the formula $YBa_2Cu_3O_{(7-x)}$ wherein x has a value less than 0.75 which comprises subjecting a thin film of non-superconducting $YBa_2Cu_3O_{(7-x)}$ wherein x has a value greater than 0.75 to an oxygen plasma near room temperature for at least one hour.

2. Method in accordance with claim 1 wherein plasma oxidation is effected in a cylindrical reactor at a power density of less than 0.005 Watts/cm³ by RF heating at an oxygen pressure of the order of 0.7 Torr. and a frequency of 13.56 $MH_z$.

3. The method treating a non-superconducting composition of a material $YBa_2CU_3O_{(7-x)}$ wherein x has a value greater than 0.75 to obtain a superconducting composition wherein x is less than 0.75 comprising subjecting the composition to an oxygen plasma near room temperature for at least one hour to assure the proper oxygen stoichiometry.

* * * * *

UNITED STATES PATENT AND TRADEMARK OFFICE
CERTIFICATE OF CORRECTION

PATENT NO. : 4,929,598

DATED : May 29, 1990

INVENTOR(S) : Brian G. Bagley and Jean-Marie Tarascon

It is certified that error appears in the above-identified patent and that said Letters Patent is hereby corrected as shown below:

Abstract, line 4, after "by" delete -- a --.

Column 1, line 26, after "helium" insert -- . --.

Column 3, line 12, change "the" to -- and --.

Signed and Sealed this

Fifth Day of May, 1992

Attest:

DOUGLAS B. COMER

*Attesting Officer*       *Acting Commissioner of Patents and Trademarks*